United States Patent [19]
Wright

[11] Patent Number: 5,793,146
[45] Date of Patent: Aug. 11, 1998

[54] SURFACE ACOUSTIC WAVE TRANSDUCER HAVING SELECTED REFLECTIVITY

[75] Inventor: Peter V. Wright, Dallas, Tex.

[73] Assignee: RF Monolithics, Inc., Dallas, Tex.

[21] Appl. No.: 425,101

[22] Filed: Apr. 20, 1995

Related U.S. Application Data

[63] Continuation-in-part of Ser. No. 151,471, Nov. 12, 1993, abandoned.

[51] Int. Cl.$^6$ .................................................. H01L 41/08
[52] U.S. Cl. .................................. 310/313 B; 310/313 D; 333/154
[58] Field of Search .................. 310/313 B, 313 D; 333/154

[56] References Cited

U.S. PATENT DOCUMENTS

| | | | |
|---|---|---|---|
| 4,162,466 | 7/1979 | Hunsinger et al. | 333/194 |
| 4,910,839 | 3/1990 | Wright | 310/313 B |
| 5,073,763 | 12/1991 | Wright | 333/193 |
| 5,162,689 | 11/1992 | Fliegel et al. | 310/313 B |
| 5,270,606 | 12/1993 | Cho et al. | 310/313 D |
| 5,313,177 | 5/1994 | Hickernell et al. | 310/313 B |
| 5,406,159 | 4/1995 | Wright | 310/313 D |
| 5,438,306 | 8/1995 | Yamanouchi et al. | 310/313 B |
| 5,475,348 | 12/1995 | Hode et al. | 333/195 |

FOREIGN PATENT DOCUMENTS

| 0255263A | 7/1987 | European Pat. Off. | H03H 9/02 |
|---|---|---|---|

*Primary Examiner*—Thomas M. Dougherty
*Attorney, Agent, or Firm*—Jones, Day, Reavis & Pogue

[57] ABSTRACT

An improved surface acoustic wave device that utilizes M electrodes per each N transduction length(s) of a transducer that produces a desired net internal distributed reflectivity in both magnitude and phase. Two of the transducers can be made placed on a single substrate and be unidirectional and caused to radiate towards each other to form a filter. A resonator, a delay line, or the like can also be formed.

7 Claims, 5 Drawing Sheets

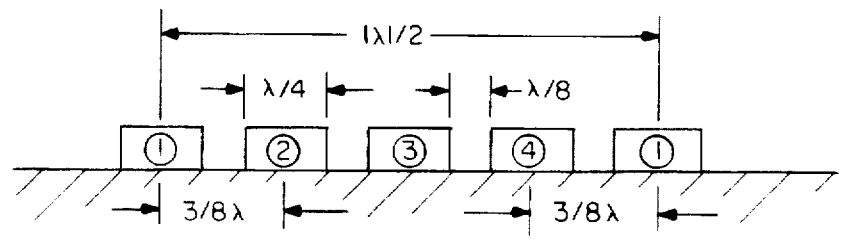
FIG. 1
PRIOR ART
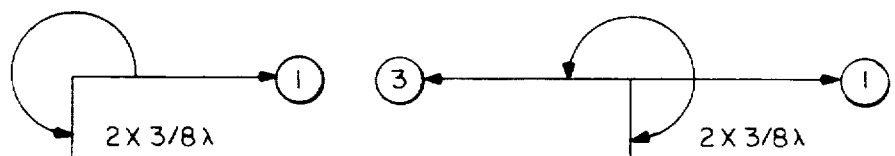
FIG. 2  FIG. 3
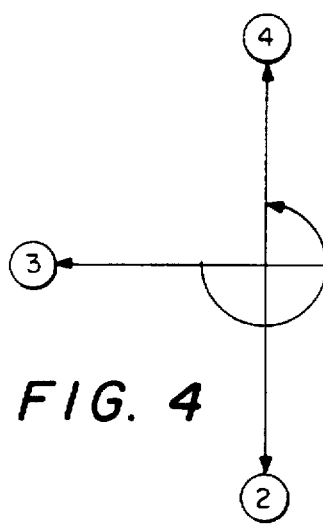
FIG. 4
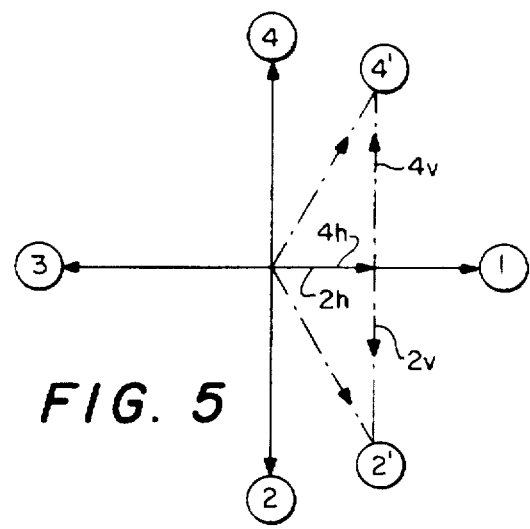
FIG. 5
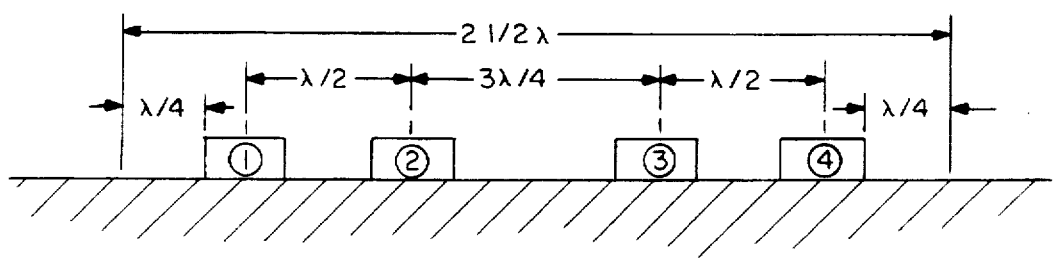
FIG. 6
PRIOR ART

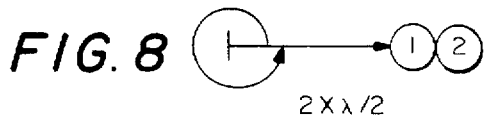
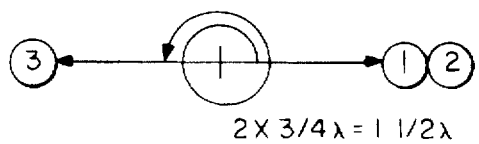
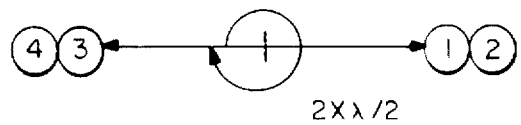
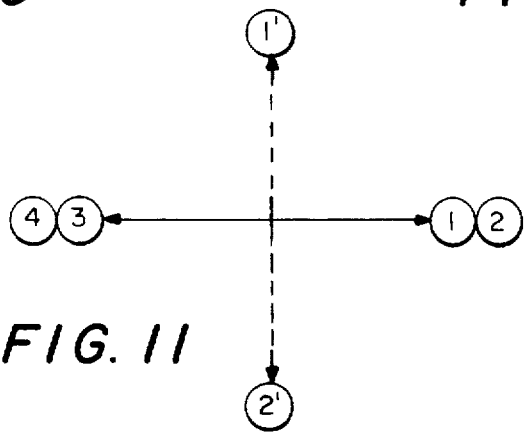
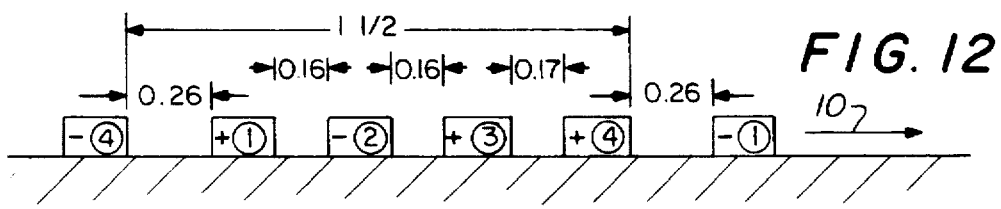
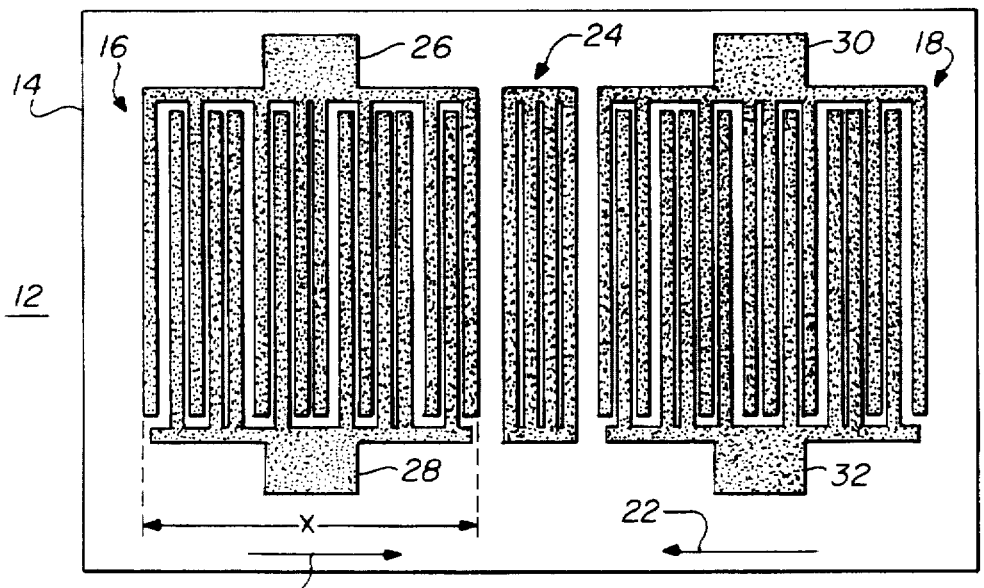

SURFACE ACOUSTIC WAVE TRANSDUCER HAVING SELECTED REFLECTIVITY

This is a continuation-in-part application of application Ser. No. 08/151,471 filed Nov. 12, 1993 now abandoned and having the same title and inventor as the present application.

FIELD OF THE INVENTION

The present invention relates in general to surface acoustic wave transducers and in particular to a new transducer having a pattern of electrodes on a piezoelectric substrate formed of M substantially equal-width, single-level, interdigitated electrodes substantially per each N wavelength(s) of the transduction length of the transducer and being spaced such that a desired reflectivity other than zero is obtained, thereby enabling a transducer to be obtained that has a reflectivity of predetermined magnitude and phase.

BACKGROUND OF THE INVENTION

Surface acoustic wave devices, known as SAW devices, have many uses in the UHF and VHF frequency ranges. SAW devices have been especially useful as impedance elements, resonators, and band-pass filters in these frequency ranges. Typical SAW devices have a substrate with at least a surface layer of piezoelectric material and surface acoustic wave transducers in interdigitated form disposed on the piezoelectric surface. The transducers convert an electrical signal to surface acoustic waves propagating on the piezoelectric surface.

SAW devices are compact, lightweight, robust, and, because they are a planar technology, are economical to manufacture. They can be mass-produced using the same techniques developed so successfully for the production of silicon integrated circuits. A wide variety of analog signal processing functions can be achieved with SAW devices. Among other applications, they are currently used in pulse compression radar systems as receiver band-pass filters or as resonators for stabilizing oscillators in numerous applications. They have replaced many of the coils, capacitors, and metal cavities of conventional radio frequency systems, removing the need for hand alignment and dramatically improving the reliability and performance of such systems. They have simultaneously resulted in significant reductions in both size and cost.

However, several problems are associated with the prior art surface acoustic wave transducers. One of the problems occurs because the transducer electrodes cause internal reflections which distort the transducer output and the shape of the input conductance which, in most cases, is undesirable. Another problem occurs when the transducer is used in filter applications. Triple transit distortion is caused by regeneration reflections between the transducers.

In order to eliminate triple transit distortion, three-phase, group-type, and single-phase devices are used to cause a greater amount of radiation in one direction in the crystal than in the reverse direction and thus form unidirectional transducers. One such device is disclosed in commonly assigned U.S. Pat. No. 4,902,925, commonly known as the "Hopscotch", and is incorporated herein by reference in its entirety. This structure employed a group type sampling with all electrode widths being $\lambda/4$. The first level of the transducer, by virtue of the electrode groupings, has no net internal reflections. Unidirectionality is achieved only by the addition of a second level metalization or by the inclusion of grooves with this structure.

Another concept for a single-phase unidirectional transducer is set forth in commonly assigned U.S. Pat. No. 4,910,839 in which, with unique crystal orientations, a simple two-electrode-per-wavelength transducer exhibited unidirectional characteristics. With this device the sense of directionality is determined by the material properties of the crystal substrate and overlay material, rather than by the transducer configuration as with other approaches.

Also, in commonly assigned U.S. Pat. No. 5,073,763, incorporated herein by reference in its entirety, a class of group-type single-phase unidirectional transducers were disclosed that can obtain unidirectional characteristics on conventional or natural crystal orientations. The sense of unidirectionality can be reversed by a change to the second level metalization or, again, by the inclusion of grooves. This transducer operated with $\frac{1}{8}\lambda$ and $\frac{3}{8}\lambda$ sampling. In these devices, the single-level versions are reflectionless. Thus, unidirectional characteristics are obtained only from the two-level structure.

Yet a further concept for implementing a unidirectional single-phase transducer is set forth in U.S. Pat. No. 4,162,465. The approach described therein employs electrodes of varying widths to achieve the desired unidirectional characteristics. This approach has the advantage of being single level. However, in general, the gaps and electrode widths in such a structure are required to be significantly smaller than in conventional SAW transducers. This is a significant drawback to its practical implementation.

Thus it would be advantageous to be able to construct a SAW transducer with unidirectional characteristics with only single-level metal and practical electrode widths and gap dimensions.

SUMMARY OF THE INVENTION

The phrase "surface acoustic wave" device, as used herein includes Rayleigh waves, surface transverse waves, leaky waves, and the like. The present invention is a transducer that has substantially equal-width, single-level, interdigitated electrodes that are spaced in a particular wavelength of the transducer such that a desired reflectivity other than zero is obtained. The average sampling period center-to-center between electrodes is N/M where N=wavelength and M=number of electrodes and excludes the cases where the sampling is totally uniform where no reflectivity occurs. This pattern of electrodes includes M equal-width, single-level, interdigitated electrodes occurring substantially per each N wavelength(s) of the transduction length of the transducer excluding the cases where net reflectivity is zero. Examples of the N/M structures with variable reflectivity include $\frac{1}{4}, \frac{1}{3}, \frac{3}{14}, \frac{4}{11}, \frac{3}{8}, \frac{7}{18}, \frac{2}{5}, \frac{5}{12}, \frac{3}{7}, \frac{7}{16}, \frac{4}{9}, \frac{5}{11}, \frac{1}{2}$, and their complements.

It is clear from U.S. Pat. No. 5,073,763 that in a transducer with a pattern of interdigitated electrodes on a piezoelectric substrate lying on a $\frac{1}{8}\lambda$ grid such that adjacent electrodes have a substantially uniform center-to-center spacing of $\frac{3}{8}\lambda$ that no net reflections exist because the reflections from the individual electrodes cancel each other. The same analysis is true with a transducer having a pattern of interdigitated electrodes such that adjacent electrodes have a center-to-center spacing of $\frac{3}{8}\lambda$ where $\lambda$ equals one wavelength. Again, there are no net reflections since the reflections from individual electrodes end up cancelling each other because of the travel path of the reflected waves from one electrode to another causing the reflected waves arriving at an other electrode to be 180° out of phase to provide the cancellation.

With the present invention, equal-width electrodes are selectively positioned within each wavelength to achieve a finite localized reflection function in both magnitude and phase. Thus, the spacing of the electrodes can be used to achieve both a phase angle and magnitude of the distributed internal reflection in a continuous manner within the transducer. An algorithm to achieve such spacing can be easily implemented on a computer by one skilled in the art.

The average separation of the electrodes, center-to-center, in two examples given herein, is either ⅜λ or ⅝λ. Thus, in these examples, there are substantially four electrodes per every 1½λ transduction lengths or four electrodes in every 2½λ transduction lengths, respectively. The center-to-center spacings of the electrodes in the new invention are not all equal so as to enable the achievement of a desired finite reflectivity.

The invention is achieved by entering into a computer minimum equal electrode width and gap constraints compatible with manufacturability, the desired frequency characteristics and load characteristics for the transducer, the substrate characteristics, and electrode material characteristics, and calculating with the computer the electrode positions within each substantially 1½λ wavelengths that results in a best approximation of the desired reflectivity of the electrodes in phase and magnitude.

Thus a transducer with single-level electrodes having a distributed internal reflection function can be implemented. Both the phase angle and magnitude of the distributed internal reflections can be achieved in a continuous manner within the transducer and the transducer can be caused to be substantially unidirectional if desired. With two of these transducers spaced from each other on a piezoelectric substrate and having the electrodes so positioned that each radiates towards the other unidirectionally, a filter is obtained with a simple pattern of single-level electrodes.

Further, a novel filter can be created by using two spaced transducers of the present invention where one of the transducers has an average sampling period center-to-center between electrodes of $N_1/M_1$ and the second transducer has an average sampling period center-to-center between electrodes of $N_2/M_2$. Each of the two transducers will have a center frequency response and out-of-band frequency response. The resultant frequency response of the combined transducers has out-of-band frequency responses that are the result of multiplying the corresponding out-of-band responses of the two transducers. If the sampling periods of the two transducers are selectively chosen, the out-of-band response may be significantly reduced as a natural result of the Fourier transform product of the two values. The center frequency will be minimally affected.

Thus it is an object of the present invention to provide a surface acoustic wave transducer with a simple pattern of single-level electrodes that provide unidirectional transmission.

It is also an object of the present invention to provide a surface acoustic wave transducer that has M electrodes unequally spaced substantially within each N wavelength(s) of the transduction length of the transducer such that a predetermined desired distributed internal reflectivity other than zero is obtained.

It is yet another object of the present invention to provide a surface acoustic wave transducer that has an asymmetrical pattern of M equal-width, single-level electrodes on a piezoelectric substrate that are unequally spaced substantially within each N wavelength(s) of the transduction length of the transducer such that a unidirectional transducer is obtained.

It is also an object of the present invention to provide a filter that utilizes a piezoelectric substrate having thereon a first transducer of the present invention with a sampling period center-to-center between electrodes of $N_1/M_1$ and a second transducer spaced from the first transducer and having a sampling period center-to-center between electrodes of $N_2/M_2$ such that at least one of the resultant out-of-band frequency responses is substantially reduced without substantially reducing the center frequency response.

Thus the present invention relates to an improved surface acoustic wave transducer having a transduction length and comprising a piezoelectric substrate, a pattern of unequally spaced electrodes on the substrate in the transduction length, the pattern being formed of M equal-width, single-level, interdigitated electrodes substantially per each N wavelength(s) of the transduction length of the transducer, and the electrodes being unequally spaced such that a desired distributed internal reflectivity other than zero is obtained.

The invention also relates to a filter comprising a piezoelectric substrate and first and second spaced transducers thereon, each transducer having a transduction length, the first transducer having $M_1$ unequally spaced, equal-width electrodes for each $N_1$ wavelength(s) and the second transducer having $M_2$ unequally spaced, equal-width electrodes for each $N_2$ wavelength(s) such that the filter frequency response has at least one attenuated out-of-band response with the center frequency being substantially unattenuated.

The invention also relates to a surface acoustic wave filter comprising first and second spaced transducers, each having a transduction length, each of the first and second transducers comprising a pattern of electrodes on a piezoelectric substrate, the pattern being formed of $M_1$ equal-width, single-level, interdigitated electrodes substantially per each $N_1$ wavelength(s) of the transduction length, the first transducer electrodes being spaced such that unidirectional transmission occurs substantially only in the direction of the second transducer, and the second transducer electrodes being spaced such that unidirectional transmission occurs substantially only in the direction of the first transducer.

BRIEF DESCRIPTION OF THE DRAWINGS

These and other objects of the present invention will be more fully disclosed in conjunction with the DETAILED DESCRIPTION OF THE DRAWINGS in which:

FIG. 1 is a diagrammatic representation of the ⅜λ spacing of the electrodes in U.S. Pat. No. 5,073,763;

FIG. 2 is a vector representation of the reflectivity of the first and second electrodes of the device of FIG. 1;

FIG. 3 is a vector representation of the first three electrodes of the device in FIG. 1;

FIG. 4 is a vector representation of all four electrodes of the device in FIG. 1 illustrating how the reflections are cancelled;

FIG. 5 is a vector representation illustrating how unidirectionality is obtained when the reflectivity of two of the electrodes are shifted in phase;

FIG. 6 is a diagrammatic representation of a ⅝λ device in which four electrodes are spaced within a 2½λ transduction length;

FIGS. 7, 8, 9 and 10 illustrate the manner in which the electrodes of FIG. 6 provide a cancellation of reflections such that no net reflections occur in the ⅝λ device;

FIG. 11 is a vector representation similar to that illustrated in FIG. 10 showing how unidirectionality can be obtained by phase shifting two of the reflection vectors;

FIG. 12 is a schematic representation of an example of the present embodiment in which a transducer of the present invention is so constructed with four equal-width electrodes unequally spaced in a 1½ wavelength transduction length (equivalent to a ⅜ ratio) so as to cause substantially unidirectional transmission in one direction;

FIG. 13 is a schematic representation of a filter formed of two transducers similar to those in FIG. 12;

DETAILED DESCRIPTION OF THE DRAWINGS

Figure 14:
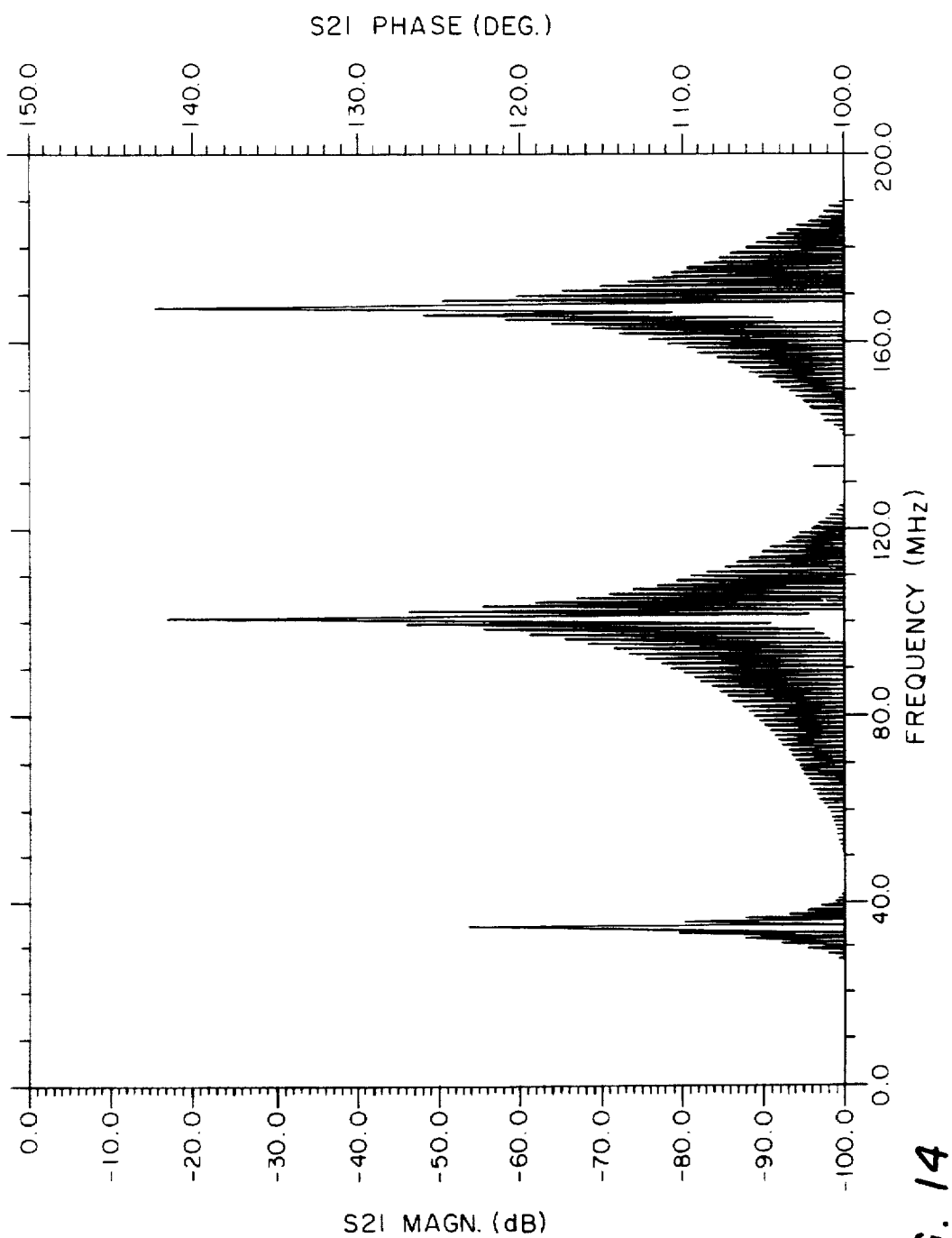
FIG. 14 is a graph of the frequency response of one transducer in FIG. 13 having an $N_1/M_1$ sampling ratio of ⅜.

FIG. 1 illustrates the prior art arrangement of ⅜λ group sampling to obtain a reflectionless transducer as disclosed in U.S. Pat. No. 5,073,063. As can be seen in FIG. 1, four single electrodes 1, 2, 3, and 4, are located within a transduction length of 1½ wavelengths. A transduction length is defined herein as a length of a transducer in which the electrodes are coupled to a signal bus and in which transduction is occurring. Such length would not include grating electrodes and the like. As can be seen in FIG. 1, each of the four electrodes are λ/4 and have a center-to-center spacing of ⅜λ.

FIGS. 2, 3, and 4 illustrate how the device of FIG. 1 produces no net reflections. Assume in FIG. 2 that the reflection from electrode 1 has a phase as shown. The reflection from electrode 2 gets back to electrode 1 in a travel path of two times the ⅜λ spacing of the adjacent electrodes or ⁶⁄₈λ or ¾λ. Thus as shown in FIG. 2, the second electrode produces a reflection ¾ths of a wavelength or 270° later. The reflection between the second and third electrodes again is twice the ⅜λ electrode separation or ¾λ as shown in FIG. 3. Thus the reflection of electrode 3 exactly opposes the reflection of electrode 1. Finally, as can be seen in FIG. 4, the reflection between the third and fourth electrodes occurs again twice the separation distance of ⅜λ or ¾λ and, as shown in FIG. 4, the reflection from electrode 4 exactly cancels the reflection of electrode 2. Thus there is no net reflection from the device of FIG. 1.

Clearly, as can be seen in FIG. 5, if the reflection of the electrodes could be phase shifted then a net reflection could be obtained. For instance, as illustrated in FIG. 5 if the reflection from electrode 2 could be phase shifted to the point or position illustrated by 2' and the reflection of electrode 4 could be shifted to the position represented by 4', then the reflection from electrodes 1 and 3 would still cancel, the vertical components 2V and 4V would cancel leaving the horizontal components 2H and 4H which would be added together to provide unidirectional reflectivity to the right in FIG. 5.

FIG. 6 illustrates the structure for a ⅜λ group sampling as disclosed in U.S. Pat. No. 5,073,763. Again, there are four electrodes spaced non-uniformly within a 2½λ transduction length. As can be seen in FIGS. 7, 8, 9 and 10, the net reflection from such structure is zero. FIG. 7 illustrates the reflection at a given phase represented by electrode 1. Since the electrode 2 is spaced λ/2 from electrode 1, the reflection from electrode 2 arrives back at electrode 1 in phase with the reflection from electrode 1 as illustrated in FIG. 8. The reflection from electrode 3 has to travel twice the 3λ/4 separation or 1½λ such as shown in FIG. 9, such that the reflection from electrode 3 opposes the reflection of electrodes 1 and 2. The reflection of electrode 4, however, again travels a round-trip distance to electrode 3 of 2 times λ/2 or λ and thus ends up in phase with the reflection of electrode 3 as shown in FIG. 10. Clearly, as can be seen in FIG. 10, the reflections of electrodes 1 and 2 cancel the reflections of electrodes 3 and 4.

Suppose, however, the reflection from each of the electrodes 1 and 2 could be phase shifted 90° each to the positions shown in FIG. 11 by reflections 1' and 2'. Clearly then, the reflections from 1' and 2' exactly cancel leaving the reflections 3 and 4 to be additive to the left in FIG. 11. Thus, the reflection from the device in FIG. 5 would be unidirectional to the left if such variation in phase could be achieved.

FIG. 12 illustrates the concept of the present invention with an electrode pattern that was actually constructed to achieve the desired results set forth earlier. In the present example, the electrode widths are 3λ/16, although that is not critical to the invention. Any desired width of the electrodes can be used. The electrode widths merely need to be equal in any one case. The minimum transduction length is 1½λ in length and has four electrodes therein. Thus the sampling rate is N/M=1½/4=⅜ in this case, and the computer is asked to move the electrodes 1, 2, 3, and 4 such that for a given frequency, a desired internal localized reflection coefficient is achieved both in magnitude and phase. For example, the electrode positions in FIG. 12 have been chosen such that unidirectionality will occur substantially to the right as shown by arrow 10. The actual example obtained as shown had four electrodes with repeating gaps in each 1½λ including a first gap of 0.26λ, a second gap of 0.16λ, a third gap of 0.16λ, and a fourth gap of 0.17λ. With such a computer-generated positioning of the electrodes 1, 2, 3 and 4, the transducer electrodes in the example radiate substantially to the right as illustrated by arrow 10. Thus, the transducer is substantially unidirectional in the direction indicated.

FIG. 13 illustrates a filter 12 formed of such transducers illustrated in FIG. 12. The transducers 16 and 18 are formed on a piezoelectric substrate 14 and have input terminals 26 and 28 and output terminals 30 and 32. They have electrodes 24 that simply maintain wave velocity constant and include a plurality of interdigitated electrodes of the type illustrated in FIG. 12 where there are four equal-width, single-level interdigitated electrodes substantially for each given length of transduction length N=X as illustrated in FIG. 13 where the transduction length N=X equals a multiple of 1½λ or a multiple of 2½λ, e.g., 3 or 5. Notice that the transduction length does not include any grating electrodes. Transducer 18 in the example is simply a mirror image of transducer 16 using the pattern of FIG. 12. With such a device, transducer 16 on the left can be made to radiate to the right as indicated by arrow 20 while transducer 18 on the right can be made to radiate to the left as indicated by arrow 22. Thus the two transducers communicate only with each other. As stated earlier, the net internal reflection coefficient can be adjusted as desired. Further, one of the transducers shown in FIG. 13 may be constructed other than as disclosed herein.

Consider, for example, the frequency response curve shown in FIG. 14 of a transducer 16 in FIG. 13 of N/M= 1½/4=⅜. Notice the very high out-of-band response on the right of center frequency (100 MHz) at approximately 166.6 MHz and the high out-of-band response on the left at approximately 33.3 MHz.

Figure 15:
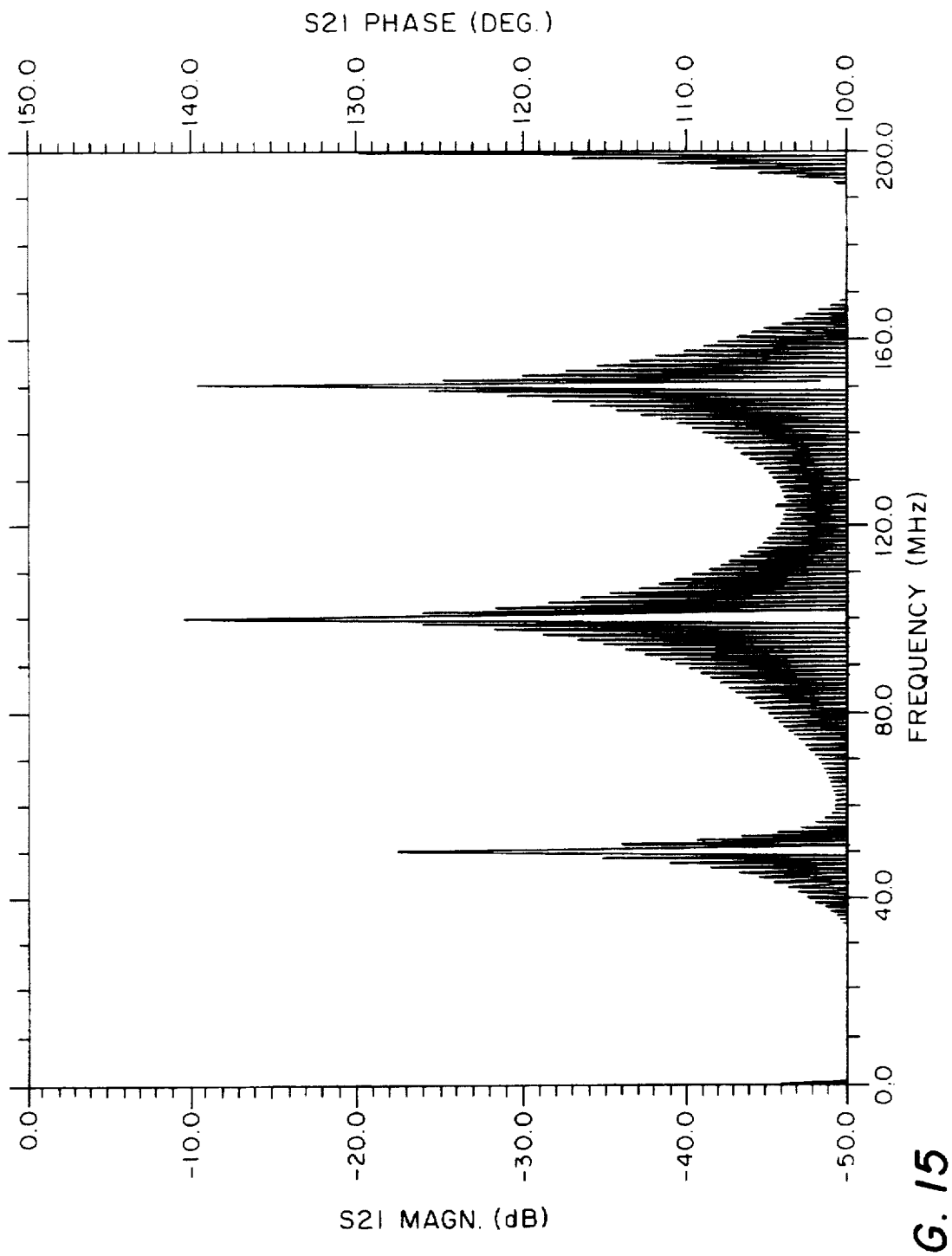
FIG. 15 is a graph of the frequency response of the other transducer of FIG. 13 having a $N_2/M_2$ sampling rate of ⅖.

Consider next the frequency response curves shown in FIG. 15 of a transducer 18 in FIG. 13 of $N_2/M_2=\frac{2}{5}$. Notice, again, the very high out-of-band response on the right of center frequency (100 MHz) at approximately 150 MHz and the high out-of-band frequency response on the left of the center frequency at approximately 41 MHz.

Figure 16:
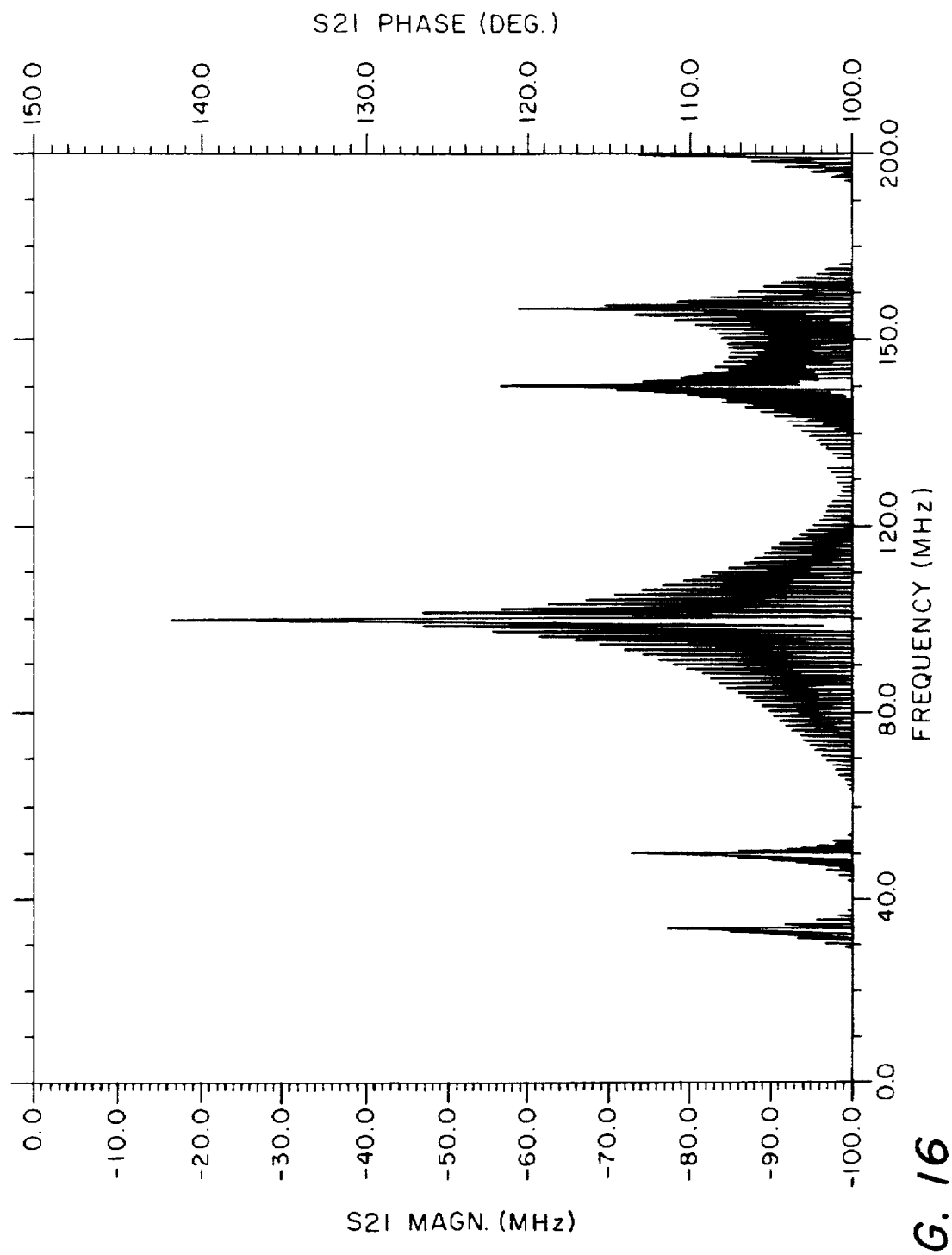
FIG. 16 is a graph of the frequency response of the entire filter of FIG. 13 wherein one transducer has an $N_1/M_1$ sampling rate of ⅜ and the other transducer has an $N_2/M_2$ sampling rate of ⅖ and illustrating how the out-of-band responses of the filter have been substantially reduced by the novel combination of transducers with different sampling rates.

Interestingly, if a filter is formed of these two transducers, $N_1/M_1=\frac{1}{8}$ and $N_2/M_2=\frac{2}{5}$, a frequency response is obtained as shown in FIG. 16. The low out-of-band frequency response occurring on the left side of the center frequency is caused by the Fourier transform when the out-of-band frequency response at 33.3 MHz of the first transducer is multiplied times the 41 MHz out-of-band frequency response of the second transducer. In like manner, the low out-of-band frequency response on the right side of center frequency in FIG. 16 is caused by the Fourier transform when the out-of-band frequency response at 166.6 MHz of the first transducer is multiplied by the out-of-band frequency response at 150 MHz of the second transducer. Note that this out-of-band response in FIG. 16 is down approximately 55 db.

Thus, it can be seen that by choosing a particular mix of transducers, the filter response can be tailored to meet a variety of needs.

Clearly, the novel transducer disclosed herein implements a desired internal distributed reflectivity in both magnitude and phase. It is accomplished by positioning four electrodes in a given transduction length, N, of the transducer such as $1\frac{1}{2}\lambda$ or $2\frac{1}{2}\lambda$ that a desired internal distributed reflectivity other than zero is obtained. Thus because the desired internal distributed reflectivity can be predetermined in magnitude and phase, a substantially unidirectional transducer can be obtained with a simple pattern of single-level electrodes. By utilizing two of such transducers on a substrate facing each other, a novel filter can be obtained. Clearly the device could also be used as a delay line, a resonator, or other devices for other uses of surface acoustic wave devices.

While the invention has been described in connection with a preferred embodiment, it is not intended to limit the scope of the invention to the particular form set forth, but, on the contrary, it is intended to cover such alternatives, modifications, and equivalents as may be included in the spirit and scope of the invention as defined by the appended claims.

I claim:

1. An improved surface acoustic wave transducer having a transduction length measured in wavelengths and comprising:

a piezoelectric substrate;

a pattern of electrodes on the substrate in the transduction length, the pattern being formed of M equal-width, single-level, interdigitated electrodes substantially per each N transduction wavelength of the transducer;

a first non-uniform spacing between said electrodes within one transduction wavelength, N, such that a first finite localized reflection function other than zero in both magnitude and phase is obtained;

a second different non-uniform spacing between electrodes within at least one second transduction wavelength in said transducer to form a second different finite localized reflection function other than zero in both phase and magnitude; and the combined first and second finite localized reflections of all transduction wavelengths achieving a continuous desired distributed internal reflection within the transducer.

2. An improved surface acoustic wave transducer as in claim 1 wherein N=1½ and M=4.

3. An improved surface acoustic wave transducer as in claim 1 wherein N=2½ and M=4.

4. A surface acoustic wave filter comprising:

first and second spaced transducers, each having a transduction length measured in wavelengths;

each of said first and second transducers including a pattern of non-uniformly spaced electrodes on a piezoelectric substrate, the pattern being formed of M equal-width, single-level, interdigitated electrodes substantially per each N transduction wavelength;

first non-uniform spacing between said electrodes of said first transducer within a first one of the transduction wavelengths, N, such that a first finite localized reflection function other than zero in both magnitude and phase is obtained;

a second different non-uniform spacing between electrodes of said first transducer within at least a second one of the transduction wavelengths, N, in said first transducer to form a second different finite localized reflection function other than zero in both phase and magnitude;

a first non-uniform spacing between said electrodes of said second transducer within a first one of the transduction wavelengths, N, such that a first finite localized reflection function other than zero in both magnitude and phase is obtained;

a second different non-uniform spacing between electrodes of said second transducer within at least a second one of the transduction wavelengths, N, in said first transducer to form a second different finite localized reflection function other than zero in both phase and magnitude; and providing unidirectional transmission from each transducer substantially only in the direction of the other transducer, the combined first and second finite localized reflections of all transduction wavelengths of both the first and second transducer achieving a continuous desired distributed internal reflection within each of the transducers.

5. A surface acoustic wave filter as in claim 4 wherein N=1½ and M=4.

6. A surface acoustic wave filter as in claim 4 wherein N=2½ and M=4.

7. A surface acoustic wave filter comprising:

first and second spaced transducers, each having a transduction length;

each of said first and second transducers including a pattern of non-uniformly spaced electrodes on apiezoelectric substrate, the pattern being formed of M equal-width, single-level, interdigitated electrodes substantially per each N transduction wavelength(s);

said first transducer being constructed with 5 non-uniformly spaced electrodes in each 2 transduction wavelengths such that unidirectional transmission occurs substantially only in the direction of the second transducer; and said second transducer being constructed with 4 non-uniformly spaced electrodes in each 1½ transduction wavelengths such that unidirectional transmission occurs substantially only in the direction of the first transducer.

\* \* \* \* \*